United States Patent [19]
Wagner

[11] Patent Number: 4,548,883
[45] Date of Patent: Oct. 22, 1985

[54] CORRECTION OF LITHOGRAPHIC MASKS

[75] Inventor: Alfred Wagner, Berkeley Heights, N.J.

[73] Assignee: AT&T Bell Laboratories, Murray Hill, N.J.

[21] Appl. No.: 499,774

[22] Filed: May 31, 1983

[51] Int. Cl.[4] ............................................. G03F 9/00
[52] U.S. Cl. ........................................ 430/5; 430/323; 430/331; 430/961; 427/38; 156/643
[58] Field of Search .................... 430/5, 313, 314, 945, 430/323, 331, 961; 427/38, 140; 156/643

[56] References Cited

U.S. PATENT DOCUMENTS

| | | | |
|---|---|---|---|
| 3,748,975 | 7/1973 | Tarabocchia | 430/5 |
| 4,085,330 | 4/1978 | Wolfe | 250/492 A |
| 4,253,029 | 2/1981 | Lepselter et al. | 250/505 |

FOREIGN PATENT DOCUMENTS

| | | | |
|---|---|---|---|
| 2638474 | 3/1977 | Fed. Rep. of Germany | 430/5 |
| 55-101947 | 8/1980 | Japan | 430/5 |
| 55-150225 | 11/1980 | Japan | 430/5 |
| 56-52751 | 5/1981 | Japan | 430/5 |
| 57-102019 | 6/1982 | Japan | 430/5 |

OTHER PUBLICATIONS

Hawley, Condensed Chemical Dictionary, 8th Ed., Van Nostrand Reinhold Co., New York, 1971, p. 822.
Enrlich et al., IEEE Electron Device Letters, vol. EDL-1, No. 6, Jun. 1980, pp. 101-103.
Gloersen, "Masking for Ion Beam Etching", Solid State Technology, Apr., 1976, pp. 68-73.
"1X Mask and Reticle Technology," Semiconductor International, 1983, pp. 40-45, P. S. Burggraaf.
"A Microprocessor-Controlled Mask Inspection and Repair System," Solid State Technology, R. A. Kaplan, 1976, pp. 74-78.
"One-Step Repair of Transparent Defects in Hard-Surface Photolithographic Masks Via Laser Photodeposition," IEEE Electron Device Letters, vol. EDL-1, D. J. Ehrlich et al., 1980, pp. 101-103.
"Direct Writing of Refractory Metal Thin Film Structures by Laser Photodeposition," Journal of the Electrochemical Society, D. J. Ehrlich et al., 1981, pp. 2039-2041.

Primary Examiner—Mary F. Downey
Assistant Examiner—José G. Dees
Attorney, Agent, or Firm—James H. Fox

[57] ABSTRACT

A lithographic mask is corrected by ion beam removal of material at the location of a defect after the mask is initially formed. In the case of defects due to excess material (opaque defects), the ion beam removes the excess opaque material. In the case of pinholes (clear defects), the substrate (typically glass) is rendered opaque. The ion beam may be used for imaging the defect, typically by detection of secondary electrons or photons emitted where the ion beam impinges on the mask. Optical masks (visible, ultraviolet) and X-ray masks, among others, can be corrected.

6 Claims, 8 Drawing Figures

CORRECTION OF LITHOGRAPHIC MASKS

BACKGROUND OF THE INVENTION

1. Field of the Invention

The present invention relates to a method of correcting lithographic masks used in the production of solid-state devices.

2. Description of the Prior Art

Lithographic shadow masks are used extensively in the production of solid-state devices, including semiconductor devices, magnetic bubble devices, etc. The pattern contained in the shadow mask is reproduced onto the surface of a device precursor, typically by the irradiation of a radiation-sensitive resist material on the precursor. The variety of radiation sources for lithography that have been used or proposed includes visible light, ultraviolet light, X-ray radiation, electrons, and ions. When illuminated by a broad beam of the radiation, the shadow mask serves to selectively block portions of the radiation beam while allowing other portions to be transmitted therethrough. In this manner, very complex geometries having very small minimum line widths can be reproduced, allowing the economical production of very large scale integrated circuits and other devices.

A single shadow mask is typically employed a large number of times for the production of numerous solid-state devices. In this manner, the precision and time-consuming techniques used to make the shadow mask need not be repeated for every device, but rather the precision inherent in the shadow mask is transferred to every device. However, this places stringent demands upon the quality of a shadow mask, since any flaws or defects are reproduced in the device precursor, which reduces the yield of usable devices. For typical projection printing, a mask having the same feature dimensions as the resulting device (1:1 printing) typically allows about 100 semiconductor chips to be simultaneously exposed to lithographic radiation on a single 4 or 5 inch diameter wafer at a given time. However, since the size of the feature on the mask is essentially the same as the resulting feature size in the device that is made, and since feature sizes are currently on the order of about 2 micrometers and constantly being reduced, it is apparent that the mask must be made with very high precision.

Another lithography technique makes use of a reduction lens, typically 5:1 or 10:1, which allows the features on the mask to be correspondingly larger than the features on the solid-state device. Thus, a 1 micron line can be reproduced with a 5 micron wide feature on a lithographic mask using a 5:1 reduction lens. However, such reduction systems typically expose only a single chip, or perhaps a small number of chips on a wafer, to the patterning irradiation at one time, rather than exposing an entire wafer at one time. Any defect on the mask that would cause the resulting device to malfunction results in essentially zero yield of usable devices, since all the devices are exposed through the same mask pattern. Hence, it is imperative that masks for the repeated exposure systems be essentially perfect; such systems are typically referred to as "steppers" in the art, as portions of a wafer are moved in steps under the shadow mask.

Combining the most troublesome features of both of the above techniques are the anticipated x-ray stepper lithography systems. In these systems, typically only one chip, or perhaps a few chips, are exposed at one lithography step on a given portion of a wafer. Hence, the mask must be substantially perfect, as noted above. However, no reduction lenses can be used, since X-rays are not conveniently refracted by available optical components. Hence, the 1:1 resulting reduction ratio implies that the features on the X-ray masks will be very small. It is anticipated that such masks will have feature sizes of 1 micron or less.

Optical masks (i.e., those for use with visible or ultraviolet light) are commonly repaired by laser evaporation of opaque chrome defects, and inking or lift-off chrome metallization for clear (pinhole) defects. Laser repair of opaque defects has a resolution typically limited to about 1 micron by the size of the focused laser spot and thermal diffusion due to the mask substrate. Precise control of feature size and placement is not easily achieved with laser evaporation. This can make edge reconstruction of fine features difficult, particularly in tight geometries, that is, those having minimum dimensions of about 2 micrometers or less. The resolution and feature size and placement control for clear defect repair are generally worse, making edge reconstruction even more difficult.

Defects in X-ray masks tend to be opaque and at a density about 1 order of magnitude greater than optical masks. No attractive repair methods have been described for X-ray masks. Laser repair of these opaque defects does not seem feasible. Substantial thermal diffusion due to the large thickness of the metal absorber (typically about 0.5 to 1.0 micrometer gold for an X-ray mask versus about 800 Angstroms of chrome on an optical mask) results in poor resolution and control of feature size and shape. This is particularly troublesome because X-rays are likely to be used only for submicron lithography. Metal redeposition due to the high aspect ratio of the X-ray mask features, and damage to the supporting membrane, are also problems with prior art repair techniques.

In forming the mask initially (i.e., before repair), typically a metal coated substrate is coated with a radiation-sensitive resist and exposed to patterning radiation. Focused electron beams that scan across the resist and selectively expose the resist are frequently used as the patterning radiation. However, optical radiation is also used, especially with masks having relatively large features. The exposed resist is then developed and the pattern transferred into the metal layer by etching. It has been proposed to avoid the resist exposure and development steps entirely by directly patterning the metal layer with an ion beam that mills away the metal to form the pattern. However, that technique is entirely impractical with commercially useful masks for very large scale integrated circuits, using available ion sources. For example, at a beam current density of 1 amp/cm$^2$ (e.g., a 1000 Angstrom diameter beam having a current of $10^{-10}$ amps), to pattern at 50 percent density an area of 1 cm$^2$ in 850 Angstrom thick chrome, requires a time of over 4 years. Hence, workers in the art have not pursued the use of ion beams for direct formation (i.e., without resists) of complex patterns.

SUMMARY OF THE INVENTION

I have invented a method of correcting a lithographic mask used in the production of solid-state devices. In the present technique, an ion beam is directed to the location of a desired change after the formation of the lithographic pattern of the mask. In the case of defects due to excess material (opaque defects), the ion beam removes the excess material. In the case of pinholes (clear defects), the substrate of the mask is rendered opaque by the creation of a region wherein the light is diffracted, refracted, internally reflected, or scattered sufficiently to substantially prevent transmission of the lithographic radiation through the mask at that point. The ion beam can also be used for imaging the area to be corrected, typically by detection of secondary electrons or photons emitted where the ion beam impinges on the mask.

DETAILED DESCRIPTION

The following detailed description relates to a method of correcting shadow masks used for lithography in a wide variety of device production applications. As used herein, the term "correcting" includes repairing opaque and clear defects, as well as modifying portions of a mask. It is apparent that correction of masks will become increasingly used as feature sizes become smaller, for reasons noted above. In fact, it is anticipated that essentially 100 percent of all masks will be "repaired" during their production for feature sizes of perhaps 1 micrometer or less. Hence, the present technique is essentially a device production technique, with the value residing in the very ability to economically make solid-state devices that have features below a given size.

In the present technique, an ion beam impinges the mask in the vicinity of a defect. In the case of opaque defects wherein excess material is present on the mask, the ion beam removes the excess material. This is accomplished by physical sputtering of the material, which results in a substantial nonthermal dissociation of the sputtered material, typically down to the atomic level. Even defects contacting on edge of the desired feature on the mask can be accurately removed by this technique without substantial damage to the edge. This is due, at least in part, to the very fine geometry possible with an ion beam, and also due to the fact that relatively little thermal energy is transmitted to the mask; rather, a substantial fraction of the incoming ion energy physically sputters away the defect material. Furthermore, the nature of the defect material is relatively unimportant; that is, the thermal conductivity or physical hardness are not limiting factors in practicing the present technique. In the case of clear defects wherein a desired masking material is absent, the ion beam is used to create an opaque portion on the substrate of the mask, as further explained below. The present technique allows for initial mask formation by any prior art technique. The defects present occupy a very small total area of the mask, typically less than $10^{-5}$ of the total mask area. Hence, the present technique provides for relatively rapid initial mask formation and subsequent correction.

Figure 1:
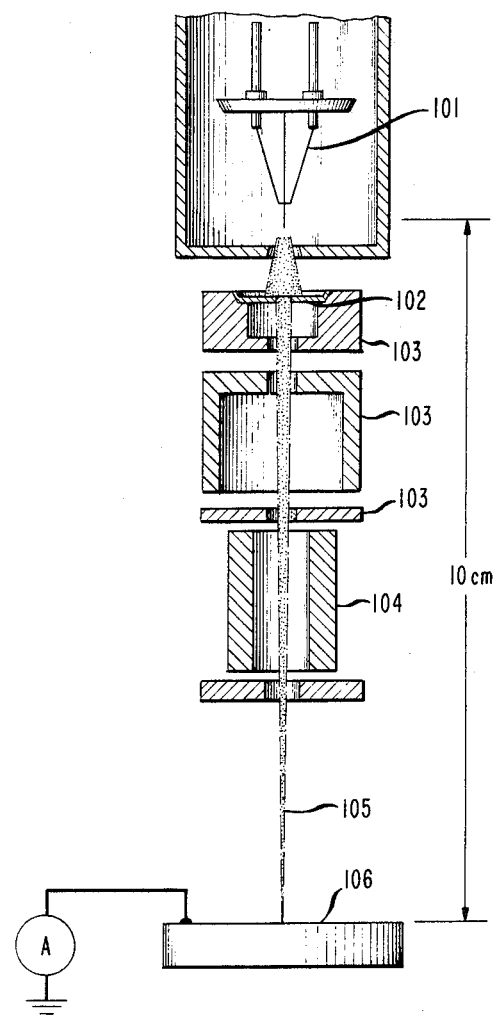
FIG. 1 shows schematically an ion beam system suitable for practicing the present invention.

Referring to FIG. 1, shown schematically is an ion beam system suitable for practicing the present invention. The ion optical column comprise a liquid metal ion source 101, an aperture 102, an electrostatic focusing lens 103, and an octapole deflector 104. This provides for a focused ion beam 105 that can be scanned as desired across the shadow mask 106. The mask is typically placed in a vacuum chamber (not shown) during ion irradiation. The liquid metal ion source typically comprises a sharpened tungsten needle wetted with a thin film of molten metal, typically gallium, indium, or gold; see "Liquid Gold Ion Source," A. Wagner et al, *Journal of Vacuum Science and Technology*, Vol. 16, page 1871 (1979). The ions are focused to a spot diameter suitable for repairing the defects in the expected size range; see "An Asymmetric Electrostatic Lens for Field Emission Microprose Applications," J. Orloff et al, *Journal of Applied Physics*, Vol. 50, page 2494 (1979). An ion beam diameter of 0.1 micron at an accelerating voltage of 20 kilovolts is typical. The octapole deflector used for scanning is further described in "Recent Advances in Electron Beam Addressed Memories," J. Kelley, *Advances in Electronics and Electron Physics*, Vol. 43, page 43, (1977). However, other ion beam configurations can be used. For example, a gas field ionization source, among others, can be used.

Figure 2:
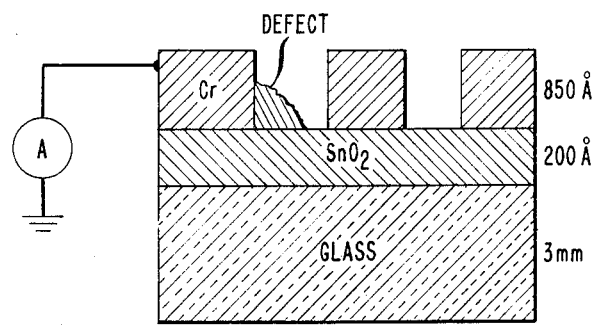
FIG. 2 shows features on a typical chrome optical mask.

Referring to FIG. 2, a typical chrome mask as used in optical lithography is illustrated schematically. The substrate comprises a glass layer that is transparent to the lithographic radiation, typically visible or ultraviolet light, to be used in exposing the device precursor. On top of the glass is deposited a thin film of tin-oxide and thereon is deposited a film of chrome. As noted above, during the initial formation of the mask, the chrome is patterned by any one of a number of suitable lithography techniques. One typical technique for mask making is by depositing an electron beam-sensitive photoresist on the unpatterned chrome layer, then scanning an electron beam to form a desired pattern in the photoresist, which is then developed; finally, the chrome is selectively etched away to form patterns, as indicated schematically in FIG. 2. As used herein, the term "substrate" means the layers of the mask that are not patterned in the initial formation of the lithographic features on the mask.

In the case of an opaque defect as illustrated in FIG. 2, an ion beam is directed at the defect until the defect is removed. The tin-oxide layer underlying the chrome pattern provides for charge conduction away from the substrate, so that the ion beam does not become defocused due to electrostatic charge buildup on the glass layer. Depending upon the size and nature of the defect, the ion beam can dwell at a single point until the defect is removed, or can be displaced as appropriate to remove a defect that is larger than the spot size of the ion beam.

One method of determining when the ion beam has removed the defect is by monitoring the current that flows between the conductive layer and the ground side of the potential source used to accelerate the ion beam.

Figure 3:
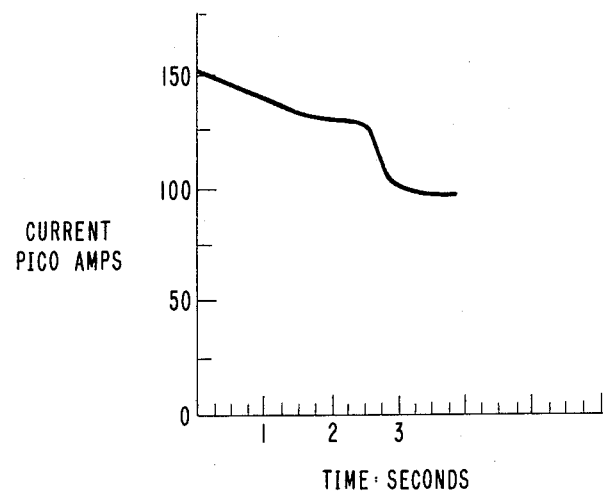
FIG. 3 shows a current monitoring technique useful with the present invention.

This current comprises a first component due directly to ion beam current, and a second component due to secondary electrons emitted from the mask into the vacuum where the ions impinge on the mask. Referring to FIG. 3, this current initially starts at a relatively high value and slowly reduces as the defect is sputtered away. However, when the ion beam has removed the defect and penetrated into the conductive layer, the tin-oxide is rendered insulating, which reduces the number of secondary electrons emitted. This results in a reduction of current, as shown in FIG. 3. (For conductive materials that remain conductive during ion irradiation, the current is reduced when the ion beam reaches a nonconductive layer, such as the glass substrate.) The defect removal can also be verified by imaging the defect by means of the scanning ion beam under conditions that do not result in a substantial removal of material. Then, emitted secondary electrons or photons are detected to form an image in the vicinity of the defect, as explained further below.

Figure 4:
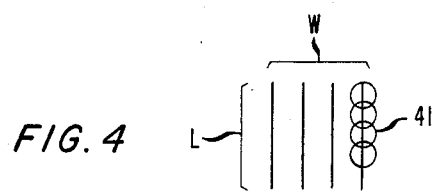
FIG. 4 shows a typical pattern of ion beam spots scanned over a defect area.

In the case of pinhole defects (i.e., area of the mask where a desired opaque feature is absent), the present technique can be used to make the mask opaque in desired portions. This is accomplished by using the ion beam to remove portions of the substrate or other layer such that the incident lithographic radiation is directed away from the device precursor sufficiently so that substantially no image results on the device precursor. Referring to FIG. 4, shown in top view is a convenient implementation provided by scanning the ion beam 41 over several parallel columns on the surface of the mask substrate. The depth of the ion beam removal in each column is adjusted to provide for features, as described in cross-section view of the mask substrate in FIGS. 5, 6, or 7.

Figure 5:
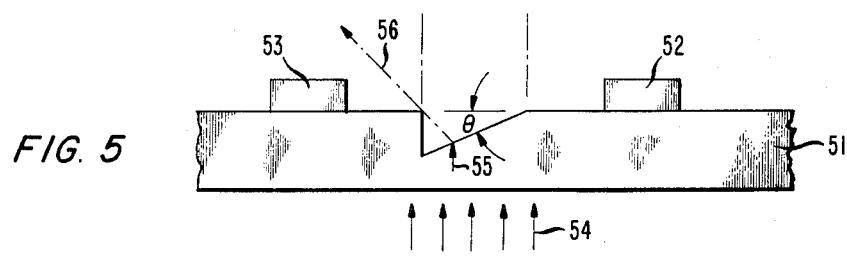
FIG. 5 shows a first method of correcting a clear defect whereby an incoming optical lithographic beam is refracted.

In a first embodiment, shown in FIG. 5, a triangular-shaped trough is formed in the location of the clear defect, such that incident lithographic radiation 55 is refracted in the direction 56 away from the device precursor. The angle $\theta$ is chosen to obtain sufficient refraction of the radiation 55 to make the mask substantially opaque in the noted region. It is also possible to make angle $\theta$ sufficiently large so that the lithographic radiation is internally reflected in the mask, and thus substantially prevented from reaching the device precursor. For a silica glass substrate in air, the critical angle for obtaining total internal reflection is about 42 degrees.

Figure 6:
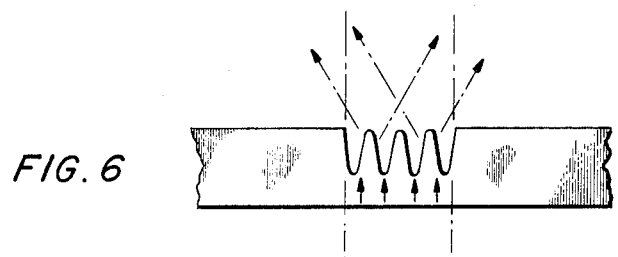
FIG. 6 shows a second method of correcting a clear defect wherein an incoming optical lithographic beam is scattered.
Figure 7:
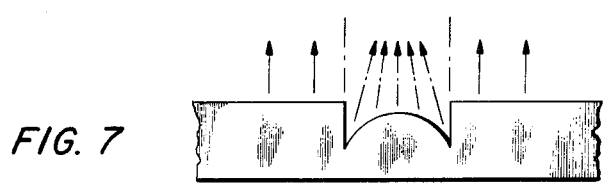
FIG. 7 shows a third method of correcting a clear defect wherein an incoming optical lithographic beam is focused to a point.

Referring to FIG. 6, in an alternate embodiment, a plurality of scattering centers is provided, wherein the incident irradiation is scattered in a multiplicity of directions. While it is possible that some of the incident irradiation is still transmitted onto the device precursor, the amplitude is sufficiently attenuated due to the scattering that substantially no imaging results. In an alternate scattering embodiment, the ion beam can form holes (not shown) that have a diameter and spacing on the order of the wavelength of the lithographic radiation. In a third embodiment, referring to FIG. 7, the ion beam forms a lens. This lens can result in the incident lithographic radiation being imaged to a focal point; on the far side of the focal point, the lithographic radiation diverges away from the device precursor. The lens can alternately be constructed so that the lithographic radiation immediately diverges therefrom.

The above principles will be more fully illustrated by means of the following Example.

EXAMPLE 1

Referring to FIG. 2, a chrome optical mask was repaired by the removal of opaque defects. The glass substrate had a thickness of approximately 3 millimeters and had a conducting layer of tin-oxide having a thickness of about 200 Angstroms. Formed thereon was a chrome layer having a thickness of about 850 Angstroms, and formed therein was a pattern having 0.5 micrometer wide lines and spaces. The mask had excess chrome material between the desired chrome lines, in the form of webbing. A 20 kilovolt beam of gallium ions having a diameter of about 1800 Angstroms, as produced by the apparatus of FIG. 1 above, was scanned step-wise across the defect area. The dwell time at a given point was adjusted to remove the material in that area down to the glass substrate. This was determined by monitoring the current induced in the tin-oxide layer, as illustrated in FIG. 3. Upon etching through the defect down to the glass, the beam was then stepped approximately $\frac{1}{2}$ beam diameter to an adjacent area of the defect. By continuing in this manner, a defect having a diameter of approximately 1 micrometer was removed in a time of about 2 seconds. Substantially similar results are obtained with the use of indium or gold ion beams.

EXAMPLE 2

This Example shows the correction of a clear defect in the mask of FIG. 2. In that structure, clear defects were present over an area of approximately 5 micrometers square. That is, the chrome was missing in that portion of the mask. To obtain an opaque region in the glass in the area of the defect, a 0.6 micrometer gallium ion beam, as otherwise described in Example 1, was scanned in 18 adjacent columns, to produce a triangular-shaped diffraction center, as shown in cross section in FIG. 5. The slope of this triangular structure was produced by allowing the ion beam to dwell for longer periods of time in adjacent columns. It was found that approximately 2 minutes was required to produce a structure in the glass layer having dimensions of 5 micrometers square and having an angle $\theta$ of about 30 degrees.

EXAMPLE 3

Figure 8:
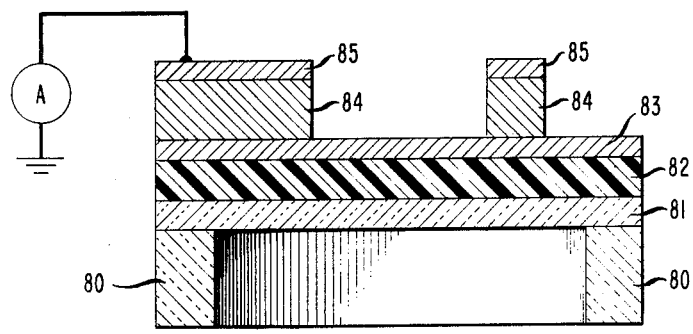
FIG. 8 shows a typical X-ray mask structure that can be repaired by the present technique.

In this Example, an X-ray mask having the structure as substantially shown in FIG. 8 is repaired by the removal of excess material that produces opaque defects. This mask structure is further described in U.S. Pat. No. 4,253,029, coassigned with the present invention. In this mask, a quartz annulus 80 supports a substrate comprising a boron-nitride layer 81 having a thickness of about 4.5 micrometers, and a polymide layer 82 having a thickness of about 2 micrometers, and having a tantalum layer 83 thereon which has a thickness of about 300 Angstroms. The absorbing portion of the mask that defines the pattern by blocking the incident X-ray irradiation comprises gold regions 84 having a tantalum layer 85 thereon. The gold typically has a thickness of around 6000 to 7000 Angstroms, and the tantalum layer is typically about 800 Angstroms thick. The opaque defects were located between the desired features 84, and it was found that an ion beam, as described in Example 1, could readily remove these opaque defects. To determine when the ion beam had penetrated the defect, the current due to the ion beam was monitored as indicated in FIGS. 3 and 8. It was found that by allowing the ion beam to penetrate into the polymide layer 82, a clear indication of defect removal was obtained without producing any significant damage to the substrate.

It is typically not possible to produce opaque regions in X-ray mask substrates to obtain the correction of a clear defect. This is because most materials do not provide for sufficient scattering or refraction of X-ray radiation. However, clear defects can be removed by first depositing an absorber material, for example gold, in the general vicinity of the defect. Then, the excess gold can be removed by the present technique to form the desired feature that is free of the clear defect.

In removing relatively thick layers of gold or other materials, I have discovered that to obtain maximum resolutions, removal should be accomplished using a multiplicity of beam exposures. That is, by scanning the beam over the portion to be removed, preferably less than 2 beam diameters of material depth is removed at each pass. A multiplicity of passes can provide for the total desired removal depth. Otherwise, the edge of a removed trough tends to slope to a greater degree than if multiple passes are used. In addition, I have discovered that an improvement in resolution is obtained when removing relatively thick layers of gold or other materials, by using a two-layer structure. The structure comprises a thin top layer, for example $\leq 1000$ Angstroms, of low sputter yield material such as molybdenum, tantalum, chromium, or aluminum covering a thick layer, for example $\leq 5000$ Angstroms, of high sputter yield material such as gold, silver, zinc, lead, bismuth or cadmium. The thin top layer inhibits the lower intensity portions of the ion beam (the wings of the beam) from eroding the underlying thick layer. This results in narrower sputtered troughs with more nearly vertical sidewalls in the thick layer than can be obtained in the absence of the thin top layer. This layer structure is inherently obtained in certain mask forming processes (see FIG. 8). In other processes, it can be provided for by an additional deposition step.

In all of the above procedures, one very desirable feature of the present technique is that the ion beam used for correcting the defect can also serve to image the defect; that is, once the approximate location of the defect area is determined, as by optical techniques or a rapidly scanning electron beam, a more detailed examination of the defect area can be obtained by detecting secondary electrons or photons that are emitted where the ion beam impinges the mask. For this purpose, especially in the case of chrome-optical masks, it is desirable to reduce the ion beam dose to allow for sufficient time to observe the defect area without removing desired material in the vicinity of the defect. I recommend an order of magnitude reduction in the ion beam dose for this purpose, as compared to that required for removing defect material. This can be facilitated by storing the image formed during a single ion beam scan of the mask portion, to allow for conveniently long viewing times. Another significant advantage of the present technique is that typically both clear and opaque defects can be corrected without removing the mask from the vacuum. This reduces handling of the mask and possible exposure to contamination or damage. After correcting the mask by the present technique, it can then be immediately placed in a pellicle, or provided with other protective means, that substantially prevents the introduction of further defects.

While the above has illustrated the use of the present technique for correcting defects in optical and X-ray masks, mask technology also includes the case of providing shadow masks for flood electron beam irradiation or flood ion beam irradiation. In addition to correcting defects, modification of a mask pattern can also be accomplished by the present technique. For example, device sizes can be optimized to obtain different characteristics from one mask to another. A mask can also be modified to compensate for deviations in a production process. Because the present technique removes material over a very small total area as compared to the area of the mask, it retains the relative rapidity of conventional mask forming processes while allowing for relatively rapid subsequent corrections. All such uses of the present technique are within the spirit and scope of the present invention.

What is claimed is:

1. A method of correcting an X-ray shadow mask that comprises a pattern of a material that is substantially opaque to X-ray radiation,

CHARACTERIZED BY depositing on said pattern a layer of a material having a relatively low sputter yield as compared to that of said pattern, and thereafter directing an ion beam at an opaque defect on said mask, whereby said defect is removed.

2. The method of claim 1 whereby said pattern essentially comprises a material selected from the group consisting of gold, silver, zinc, lead, bismuth and cadmium.

3. The method of claim 1 whereby said material having a relatively low sputter yield is selected from the group consisting of molybdenum, tantalum, chromium, and aluminum.

4. The method of claim 1 wherein said pattern as formed has a thickness of at least 5000 angstroms.

5. The method of claim 1 wherein said layer that is deposited on said pattern has a thickness of no more than 1000 angstroms.

6. The method of claim 1 wherein said ion beam is applied a multiplicity of times to said defect, wherein a depth of material is removed per application that is less than twice the diameter of said ion beam.

* * * * *